United States Patent
Hiew et al.

(10) Patent No.: US 7,802,155 B2
(45) Date of Patent: Sep. 21, 2010

(54) NON-VOLATILE MEMORY DEVICE MANUFACTURING PROCESS TESTING SYSTEMS AND METHODS THEREOF

(75) Inventors: Siew Sin Hiew, San Jose, CA (US); Charles C. Lee, Cupertino, CA (US); I-Kang Yu, Palo Alto, CA (US); Abraham Chih-Kang Ma, Fremont, CA (US); Ming-Shiang Shen, Taipei Hsien (TW)

(73) Assignee: Super Talent Electronics, Inc., San Jose, CA (US)

( * ) Notice: Subject to any disclaimer, the term of this patent is extended or adjusted under 35 U.S.C. 154(b) by 424 days.

(21) Appl. No.: 12/042,316

(22) Filed: Mar. 4, 2008

(65) Prior Publication Data

US 2008/0201622 A1    Aug. 21, 2008

Related U.S. Application Data

(60) Continuation-in-part of application No. 11/626,347, filed on Jan. 23, 2007, now Pat. No. 7,702,984, and a continuation-in-part of application No. 11/979,102, filed on Oct. 31, 2007, now abandoned, and a continuation-in-part of application No. 12/025,706, filed on Feb. 4, 2008, and a continuation-in-part of application No. 11/466,759, filed on Aug. 23, 2006, now Pat. No. 7,702,831, and a continuation-in-part of application No. 11/624,667, filed on Jan. 18, 2007, which is a division of application No. 09/478,720, filed on Jan. 6, 2000, now Pat. No. 7,257,714.

(51) Int. Cl.
*G11C 29/00* (2006.01)

(52) U.S. Cl. ..................... 714/718; 324/500; 324/527

(58) Field of Classification Search .................. None
See application file for complete search history.

(56) References Cited

U.S. PATENT DOCUMENTS

| | | | | |
|---|---|---|---|---|
| 4,398,248 A | * | 8/1983 | Hsia et al. | 365/230.03 |
| 5,581,510 A | * | 12/1996 | Furusho et al. | 365/201 |
| 6,130,442 A | * | 10/2000 | Di Zenzo et al. | 257/48 |
| 6,134,684 A | * | 10/2000 | Baumgartner et al. | 714/724 |
| 6,574,762 B1 | * | 6/2003 | Karimi et al. | 714/727 |
| 6,826,720 B2 | * | 11/2004 | Suzuki et al. | 714/720 |
| 6,829,554 B2 | * | 12/2004 | Dueregger et al. | 702/130 |
| 7,103,493 B2 | * | 9/2006 | Kang et al. | 702/117 |
| 7,197,662 B2 | | 3/2007 | Bullen et al. | |
| 7,561,938 B2 | * | 7/2009 | Akram et al. | 700/121 |
| 2007/0101214 A1 | * | 5/2007 | Stauffer et al. | 714/724 |
| 2008/0052573 A1 | * | 2/2008 | Pekny | 714/724 |

* cited by examiner

*Primary Examiner*—Jeffrey A Gaffin
*Assistant Examiner*—Steve Nguyen
(74) *Attorney, Agent, or Firm*—Roger H. Chu

(57) ABSTRACT

Systems and methods of manufacturing and testing non-volatile memory (NVM) devices are described. According to one exemplary embodiment, a function test during manufacturing of the NVM modules is conducted with a system comprises a computer and a NVM tester coupling to the computer via an external bus. The NVM tester comprises a plurality of slots. Each of the slots is configured to accommodate respective one of the NVM modules to be tested. The NVM tester is configured to include an input/output interface, a microcontroller with associated RAM and ROM, a data generator, an address generator, a comparator, a comparison status storage space, a test result indicator and a NVM module detector. The data generator generates a repeatable sequence of data bits as a test vector. The known test vector is written to NVM of the NVM module under test. The known test vector is then compared with the data retrieved from the NVM module.

9 Claims, 20 Drawing Sheets

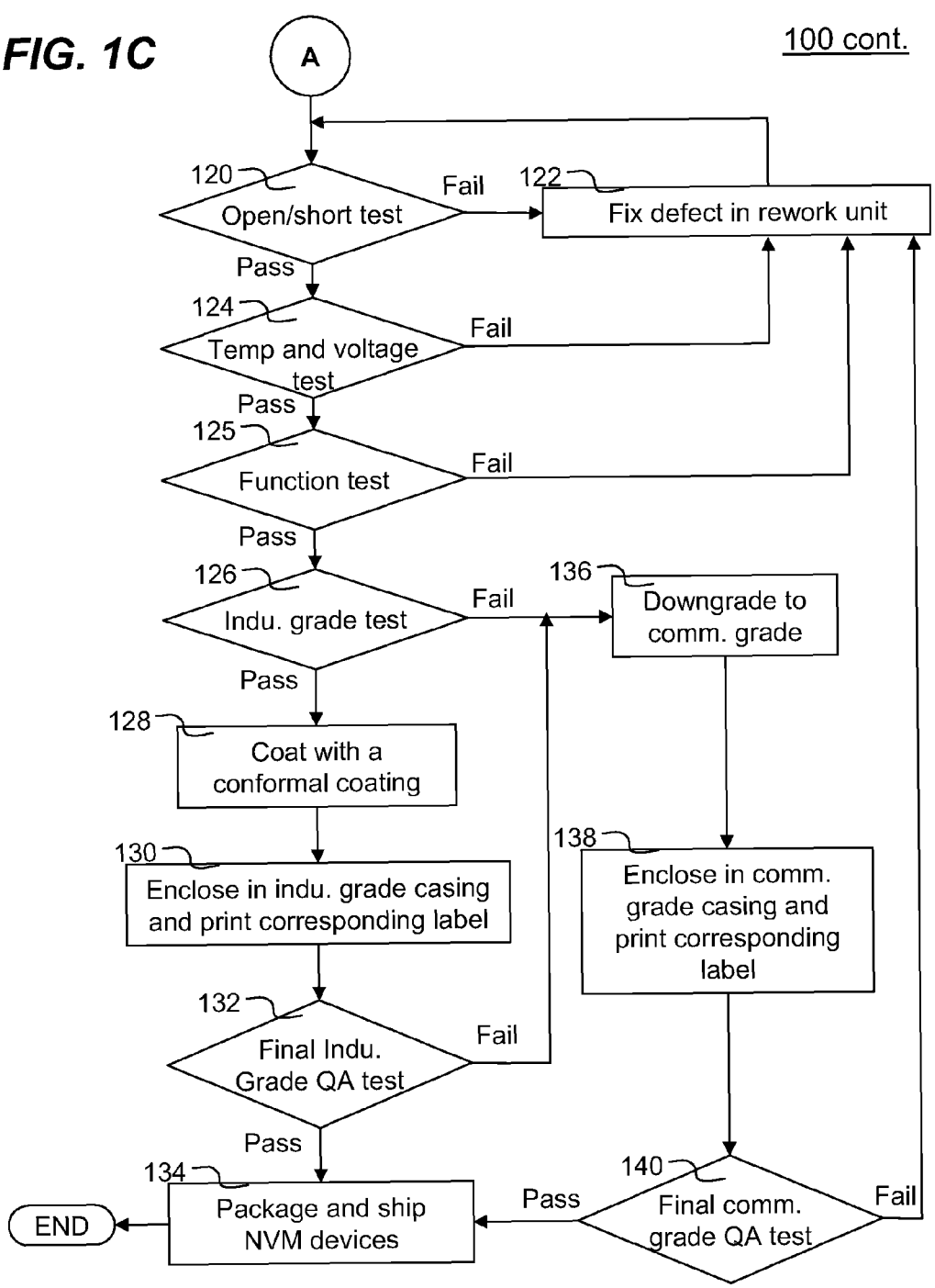

NVMD Parameter Setting

Hidden Block partition Size

| 2 | MB |

Public Area 702

| X | Partition Option | | | Partition Read Only | | | Partition Size (MB) |

| guest | Volume Label | | FAT | File System | | pub.dat | Pre-load Source File |

Secure Area 704

| X | Partition Option | | | Login Password | | | Partition Size (MB) |

| sec | Volume Label | | FAT32 | File System | | sec.dat | Pre-load Source File |

'autorun' Area 706

| X | Enabled |

| auto.dat | Pre-load Source File | | sec.dat | Pre-load Image File |

*FIG. 7A*

NVMD Parameter Setting

Vendor Area 708

Vendor Name
[                    ]

Product Name
[                    ]

Revision
[                    ]

NVM ID
[ 1234 ]

NVM Type
[ xyz A9W.. ]

LED Idle Mode
[ ON ]

Blink Interval
[ 0.5 sec ]

Parameters 710

Disk Check Option

NVM Capacity
[              ] M Bytes

NVM
[              ] chips

NVM Connection
[              ] Channel

NVM R/W Cycles
[              ] clocks

Capacity Tolerance Option

NVM Capacity Tolerance
[              ] /512 blocks

Power consumption
[              ] mA (max=500, min=0)

FIG. 7B

NON-VOLATILE MEMORY DEVICE MANUFACTURING PROCESS TESTING SYSTEMS AND METHODS THEREOF

CROSS-REFERENCE TO RELATED APPLICATIONS

This application is a continuation-in-part (CIP) of U.S. patent application for "High Volume Testing for USB Electric Data Flash Cards", Ser. No. 11/626,347, filed on Jan. 23, 2007 now U.S. Pat. No. 7,702,984.

This application is also a CIP of U.S. patent application for "System and Method for Producing High Volume Flash Memory Cards", Ser. No. 11/979,102, filed on Oct. 31, 2007 now abandoned.

This application is also a CIP of U.S. patent application for "Methods and systems for managing memory addresses in a large capacity multi-level cell (MLC) based flash memory device", Ser. No. 12/025,706, filed on Feb. 4, 2008.

This application is also a CIP of U.S. patent application for "Flash memory Controller for Electronic Data Flash Card", Ser. No. 11/466,759, filed on Aug. 23, 2006 now U.S. Pat. No. 7,702,831.

This application is also a continuation-in-part (CIP) of U.S. patent application Ser. No. 11/624,667 filed on Jan. 18, 2007, entitled "Electronic data Storage Medium with Fingerprint Verification Capability", which is a divisional patent application of U.S. patent application Ser. No. 09/478,720 filed on Jan. 6, 2000, now U.S. Pat. No. 7,257,714 issued on Aug. 14, 2007, all of which are incorporated herein as though set forth in full.

FIELD OF THE INVENTION

The present invention relates to non-volatile memory devices, and more particularly to non-volatile memory device (NVMDs) manufacturing testing systems and methods.

BACKGROUND OF THE INVENTION

Personal computers have become mainstream computing devices for the past two decades. One of the core components of a personal computer whether desktop or laptop is a mother board, which is the central or primary circuit board providing attachment points for one or more of the following: processor (CPU), graphics card, sound card, hard disk drive controller, memory (Random Access Memory (RAM), Read-Only Memory (ROM)), and other external devices. Traditionally, hard disk drives have been used as data storage in a computing device. With advance of non-volatile memory (e.g., flash memory), some attempts have been made to use non-volatile memory as the data storage.

Advantages of using non-volatile memory as data storage over hard disk drive are as follows:

(1) No moving parts;
(2) No noise or vibration caused by the moving parts;
(3) Higher shock resistance;
(4) Faster startup (i.e., no need to wait for spin-up to steady state);
(5) Faster random access;
(6) Faster boot and application launch time;
(7) Lower read and write latency (i.e., seek time);

Non-volatile memory (NVM) modules are generally manufactured in two stages by two manufacturers: a memory chip maker and a memory module assembler. The memory chip maker (e.g., fab or foundry) makes NMV chips or integrated circuits first. Then memory module manufacturers use the NVM chips to make NVM modules. Traditionally, NVM chips are tested by memory chip makers to guarantee certain level of quality, such that memory module manufacturers can confidently use the tested NVM chips to assemble NVM modules. To ensure the quality of the NVM modules assembled, the memory module manufacturers must conduct a series of tests.

However, testing NVM modules in mass quantity is a challenging problem. For example, just assembled NVM modules generally contain blank NVM chips, which are not accessible by users. There may also be different types of NVM chips from different chip manufacturers.

Therefore it would be desirable to provide efficient and effective systems and methods of testing non-volatile memory modules in mass quantity by a memory module assembler.

BRIEF SUMMARY OF THE INVENTION

This section is for the purpose of summarizing some aspects of the present invention and to briefly introduce some preferred embodiments. Simplifications or omissions in this section as well as in the abstract and the title herein may be made to avoid obscuring the purpose of the section. Such simplifications or omissions are not intended to limit the scope of the present invention.

Systems and methods of manufacturing and testing non-volatile memory (NVM) devices are disclosed. According to one aspect of the present invention, an apparatus of testing NVM modules during manufacturing comprises a main testing platform, a central processing unit (CPU) coupling to the main testing platform and a plurality of system bus slots. Each of the system bus slots is configured to receive a respective one of a plurality of NVM test modules. Each of the NVM test modules is configured to test one NVM module. The CPU is configured to issue a master test command to all of the NVM test modules adapted thereon thru the system slots. Each of the NVM test modules comprises an interface to transmit data, control signals and power between the main testing platform and the each of the NVM test modules. A test vector is generated and written to the NVM module under test. The test vector comprises a repeatable sequence of data bits. The sequence may comprise a regular pattern or a random pattern. The stored values are then retrieved and compared with the known test vector to determine whether the NVM module under test passes the function test.

According to another aspect, a system for testing NVM modules during manufacturing comprises a computer and a NVM tester coupling to the computer via an external bus (e.g., Universal Serial Bus (USB)). The NVM tester comprises a plurality of slots for accommodating the NVM modules to be tested, one slot for each module. The NVM tester is configured to include an external bus interface, a microcontroller with associated random access memory (RAM) and a read-only memory (ROM), a data generator, an address generator, a comparator, a comparison status storage space, a test result indicator and a NVM module detector. The data generator generates a repeatable sequence of data bits as a test vector. The known test vector is written to NVM of the NVM module under test according to the start and end addresses generated by the address generator. The known test vector is then compared with the data retrieved or read from the NVM module after the test vector has been written into. The test result is shown in the test result indicator.

According to one embodiment of the present invention, A method of testing a plurality of non-volatile memory (NVM) modules comprises at least the following: conducting an initial open/short test on each of the plurality of NVM modules; dividing the plurality of NVM modules into first and second groups, the first group contains said each of the plurality of NVM modules fails in the initial open/short test, while the second group contains said each of the plurality of NVM modules passes the initial open/short test; conducting a temperature and voltage test on each of the second group of the NVM modules; dividing the second group into third and fourth groups, the third group contains said each of the second group that fails the temperature and voltage test and the fourth group contains said each of the second group that passes the temperature and voltage test; conducting a function test on each of the fourth group of the NVM modules; dividing the fourth group into fifth and sixth groups, the fifth group includes said each of the fourth group that fails the function test and the sixth group includes said each of the fourth group that passes the function test; and sending all of the first, third and fifth group of the NVM modules to a rework unit for fixing failure-causing defect; wherein the open/short test is configured to detect any open and/or short condition, wherein the temperature and voltage test is configured to determine whether operating temperature and voltage tolerance are met, and wherein the function test is configured to verify whether data stored in NVM cells are reliable.

The function test further comprises coupling at least one of the sixth group of the NVM modules to a plurality of NVM test modules mounted on a main testing platform, each of the at least one of the sixth group of the NVM modules corresponds to a respective one of the plurality of NVM test modules; initializing each of the at least one of the sixth group of the NVM modules by the main testing platform; and verifying data written to said each the at least one of the sixth group with a test vector created by the respective one of the NVM test modules. The initializing each of the at least one of the sixth group of the NVM modules by the main testing platform further comprises receiving a command from the host at said each of the at least one of the sixth group of the NVM modules to check manufacturer's identification (ID) of NVM; sending the ID to the main testing platform to obtain a set of specific characteristics corresponding to the ID in a database stored thereon; receiving a boot code and a run code to perform a self test; and when the self test passes, formatting said each of the at least one of the sixth group of the NVM modules and loading an operating system image thereto.

According to another embodiment, the present invention includes an apparatus for testing a plurality of non-volatile memory (NVM) modules comprises at least the following: a main testing platform with a central processing unit mounted thereon; a plurality of NVM test modules coupling to the main testing platform, each of the test modules is configured to receive respective one of the plurality of NVM modules to be tested and each of the plurality of NVM test modules comprises: an input/output (I/O) interface configured to transmit commands and data between the main testing platform and said each of the plurality of the NVM test modules; a data generator configured for generating a repeatable sequence of data for a test vector to be written to the respective one of the plurality of NVM modules under test; an address generator configured for creating start and end addresses for the test vector; a comparator configured to compare the repeatable sequence of data of the test vector and data retrieved from the respective one of the NVM modules after the test vector has been written into; a memory space configured to store comparison status; and a set of indicators configured to show test result.

According to yet another embodiment, the present invention includes a system for testing a plurality of non-volatile memory (NVM) modules comprises at least the following: a computer; a NVM tester coupling to the computer via an external bus, the NVM tester comprises a plurality of slots, each of the slots is configured to receive respective one of the plurality of NVM modules to be tested; the NVM tester further comprises: an external bus interface configured to transmit data, control signals and power between the NVM tester and the computer; a data generator configured for generating a repeatable sequence of data for a test vector to be written to the plurality of NVM modules under test; an address generator configured for creating start and end addresses for the test vector; a comparator configured to compare the repeatable sequence of data of the test vector and data retrieved from the NVM modules after the test vector have been written into; a memory space configured to store comparison status; and a set of indicators configured to show test result.

One of the objects, features, and advantages in the present invention is that a plurality of non-volatile memory (NVM) modules may be tested with a main testing platform or a NVM tester for a function test that simulates usage of the NVM device by users. Other objects, features, and advantages of the present invention will become apparent upon examining the following detailed description of an embodiment thereof, taken in conjunction with the attached drawings.

BRIEF DESCRIPTION OF THE DRAWINGS

These and other features, aspects, and advantages of the present invention will be better understood with regard to the following description, appended claims, and accompanying drawings as follows:

FIG. 1C is a flowchart illustrating an alternative to the procedure of FIGS. 1A-B;

FIGS. 7A-B collectively shows various parameters may be included in testing of NVM modules according one embodiment of the present invention;

DETAILED DESCRIPTION

In the following description, numerous specific details are set forth in order to provide a thorough understanding of the present invention. However, it will become obvious to those skilled in the art that the present invention may be practiced without these specific details. The descriptions and representations herein are the common means used by those experienced or skilled in the art to most effectively convey the substance of their work to others skilled in the art. In other instances, well-known methods, procedures, components, and circuitry have not been described in detail to avoid unnecessarily obscuring aspects of the present invention.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments. Further, the order of blocks in process flowcharts or diagrams representing one or more embodiments of the invention do not inherently indicate any particular order nor imply any limitations in the invention.

Embodiments of the present invention are discussed herein with reference to FIGS. 1-10C. However, those skilled in the art will readily appreciate that the detailed description given herein with respect to these figures is for explanatory purposes as the invention extends beyond these limited embodiments.

Figure 1A:
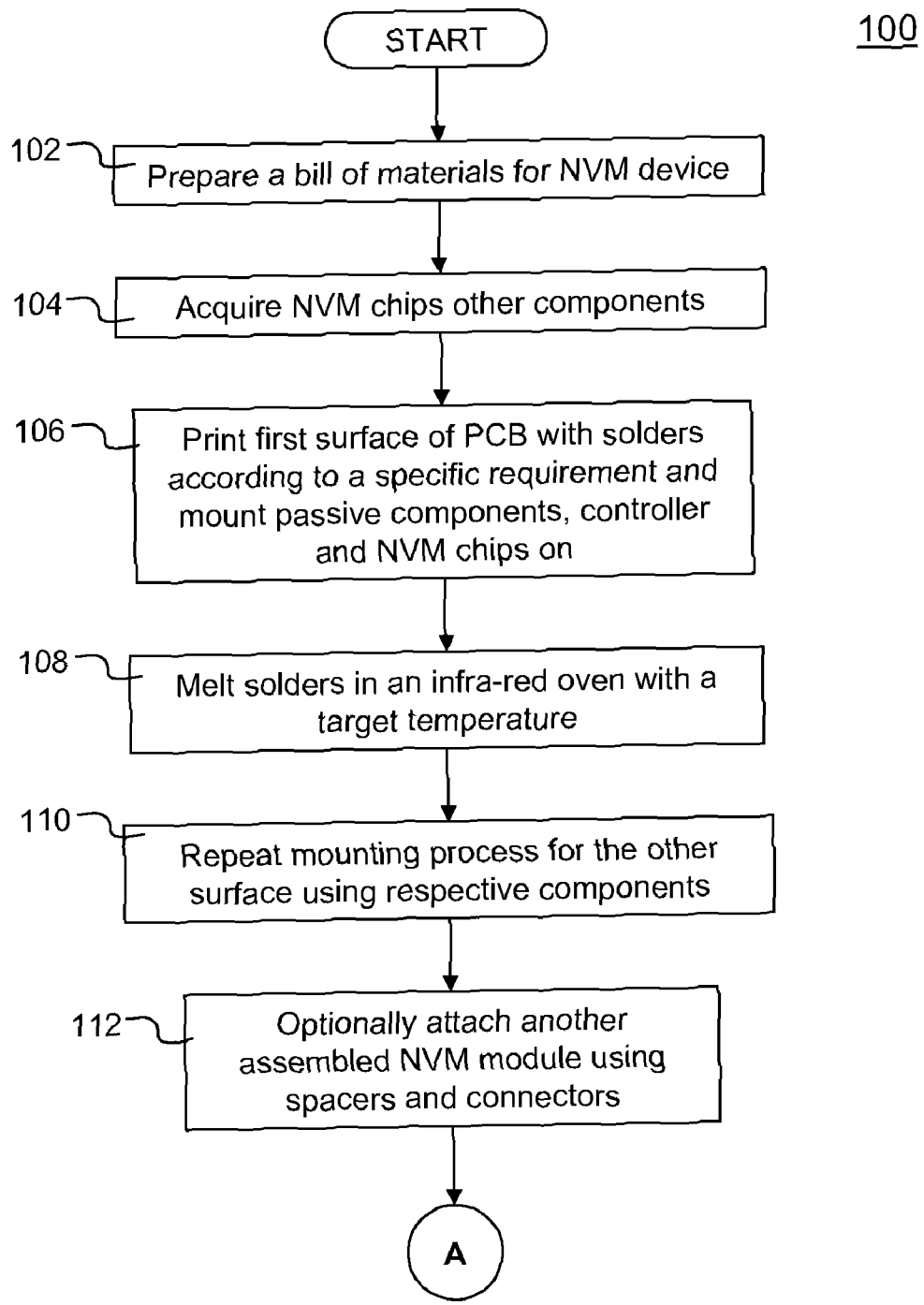
FIGS. 1A-B collectively is a flowchart illustrating an exemplary manufacturing and testing procedure of a non-volatile memory device by a memory module assembler in accordance with one embodiment of the presented invention.
Figure 1B:
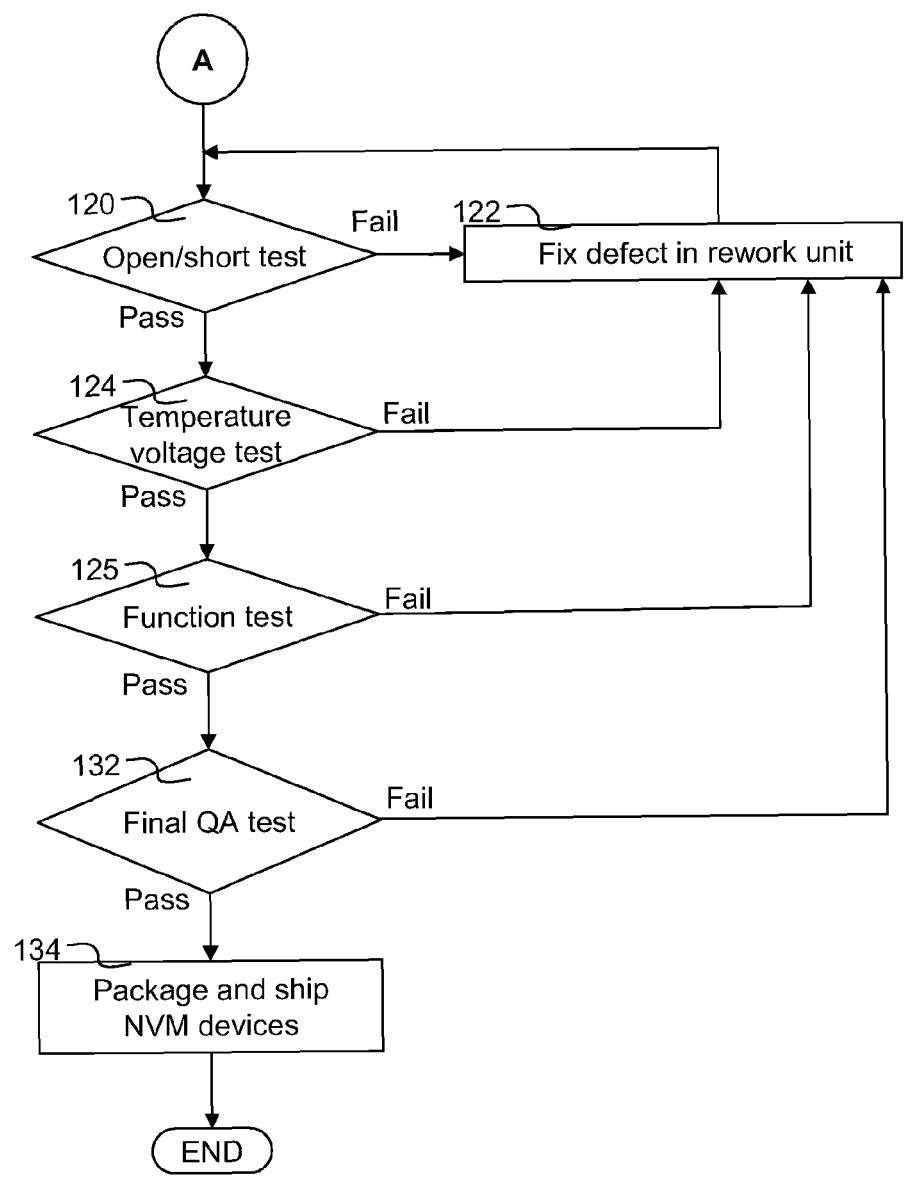

Referring now to the drawings, FIGS. 1A-B collectively is a flowchart 100 illustrating an exemplary manufacturing and testing procedure of a non-volatile memory module by a memory module assembler in accordance with one embodiment of the presented invention. The process 100 may be implemented using a series of computer based tests combined with manual inspection and rework procedures.

The process 100 starts by preparing a bill of materials required for assembler an NVM device at 102. Then, at 104, a plurality of non-volatile memory (NVM) chips or integrated circuits and other components are acquired. NVM may include, but not necessarily limited to, single-level cell flash memory (SLC), multi-level cell flash memory (MLC), phase-change memory (PCM), Magnetoresistive random access memory, Ferroelectric random access memory, Nano random access memory.

At 106, the process 100 prints solders to a first surface of a print circuit board (PCB) according to specific requirements using a custom made stencil. Components (e.g., NVM chips, NVM controller, capacitors, resistors, etc.) are then placed on the specific locations. Next, at 108, the PCB with the components placed thereon is put into an infra-red oven to melt the solders with a target temperature. The melted solders fuse the pins or contacts to form electrical connections. The process 100 repeats a substantially similar procedure for a second surface of the PCB at 110. Once a NVM module is assembled, the process 100 may optionally attach another NVM module to form a larger capacity NVM device at 112. FIGS. 2A-2D show various stages of the steps described herein.

After an NVM module is assembled together, an initial open/short test is conducted at 120. If the NVM module fails the open/short test, the failed module is sent back to a manual inspection and rework unit to correct the defects at 122. Otherwise an operating temperature and voltage test is conducted to those NVM modules that passed the open/short test at 124. Again, the failed NVM modules are sent to the rework unit at 122. Remaining NVM modules that passed the temperature and voltage test are put into a main testing platform or a NVM tester to conduct a function test at 125. Detailed procedure of the function test is described in FIGS. 5A-C and corresponding descriptions thereof. The main testing platform and a NVM tester are described in FIGS. 3A-B and 4A-B, respectively. If 'fail', the NVM modules are sent back to the rework unit at 122.

Once passed the function test, the process 100 moves to decision 132 conducting a final quality assurance (QA) test. If 'fail', any modules that failed the final QA test is sent back to the rework unit at 122. Otherwise, those NVM devices passed the industrial grade final QA test are packaged and shipped at 134 before the process 100 ends.

FIG. 1C is a flowchart illustrating an alternative to the steps of process 110 shown in FIG. 1B. The open/short, temperature and voltage and function tests are exactly the same as shown in decisions 120, 124 and 125, respectively. After passed the function test 125, the NVM modules are at least commercial grade ready after passing the function test. Next, a more stringent industrial grade test is conducted at 126. For example, the industrial grade NVM devices must be able to operate in temperature range between −40 to 85 degree Celsius. If 'pass', the process 100 covers the passed NVM modules with a layer conformal coating at 128. It is noted that connectors and pins are not coated. Then the coated NVM modules are encased in an industrial grade casing at 130. A final industrial grade quality assurance (QA) test is conducted at 132. Those NVM devices passed the industrial grade final QA test are packaged and shipped at 134.

Otherwise the NVM devices fails either the industrial grade test at 126 or the final industrial grade QA test at 132 are downgraded to a commercial grade at 136. Next, at 138, a commercial grade casing is used to encase a NVM module to form a commercial grade NVM device. Similarly, a final commercial grade QA test is conducted at 140. If 'pass', the NVM devices can be packaged and shipped at 134. Otherwise, the NVM devices that fail the final commercial grade QA test are sent back to the rework unit at 122.

Figure 2A:
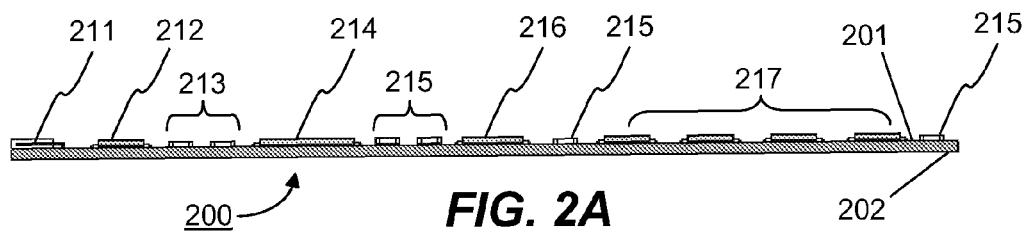
FIG. 2A is a cross-sectional view showing a non-volatile memory module after a plurality of components have been mounted on one surface.

FIG. 2A shows an exemplary NVM module 200 after a first surface 201 has been mounted with a plurality of components during assembling process. The NVM module 200 comprises a Serial Advanced Technology Attachment (SATA) connector 211, a converter 212 (i.e., converting SATA to Parallel ATA), a oscillator 213, a Redundant Array of Independent Disks (RAID) controller 214, a plurality of passive components 215 (i.e., capacitors and resistors), an Integrated Drive Electronics (IDE) controller 216 and a plurality of NVM chips 217 mounted on the first surface 201 of a PCB.

Figure 2B:
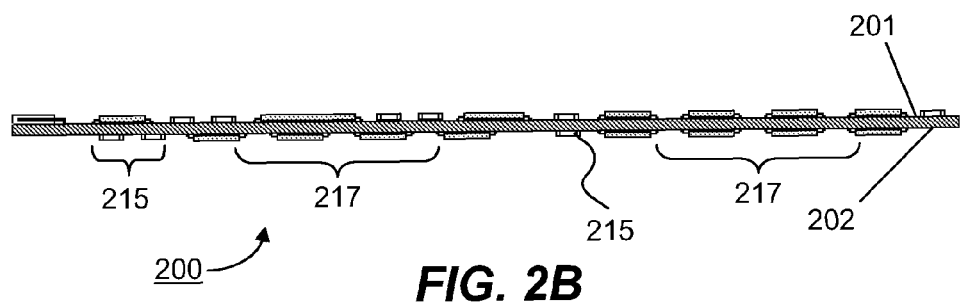
FIG. 2B is a cross-sectional view showing the non-volatile memory module of FIG. 2A after components have been mounted on both surfaces.

FIG. 2B shows the NVM module 200 of FIG. 2A after both sides have been mounted with components. On the second surface 202 of the PCB, there are a plurality of passive components 215 and a plurality of NVM chips 217.

Figure 2C:
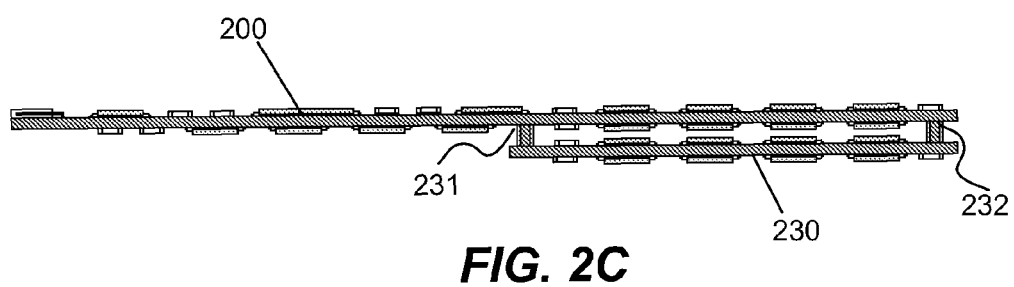
FIG. 2C is a cross-sectional view showing the non-volatile memory module of FIG. 2B including a first add-on module adapted thereon.
Figure 2D:
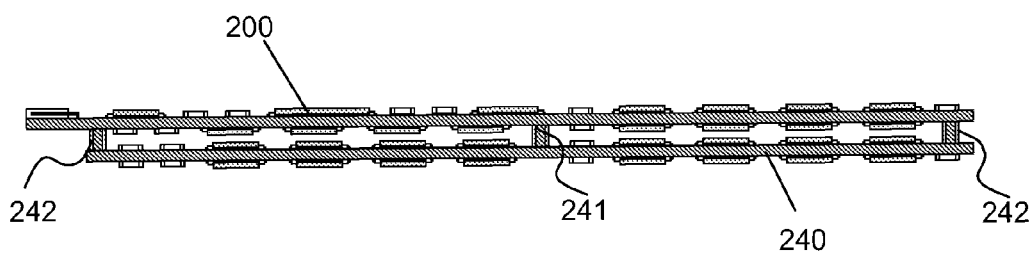
FIG. 2D is a cross-sectional view showing the non-volatile memory module of FIG. 2B including a second add-on module adapted thereon.

FIG. 2C is a cross-sectional view showing the non-volatile memory module 200 of FIG. 2B including a first add-on module 230 adapted thereon. To adapt the first add-on module 230 to the NVM module 200, a connector 231 and a spacer 232 are used. A second add-on module 240 is shown in FIG. 2D. Similarly, a connector 241 and a pair of spacers 242 are used to adapt the second add-on module 240 with the NVM module 200. The connectors 231 and 241 are configured to connect power and signal lines between two modules.

Figure 3A:
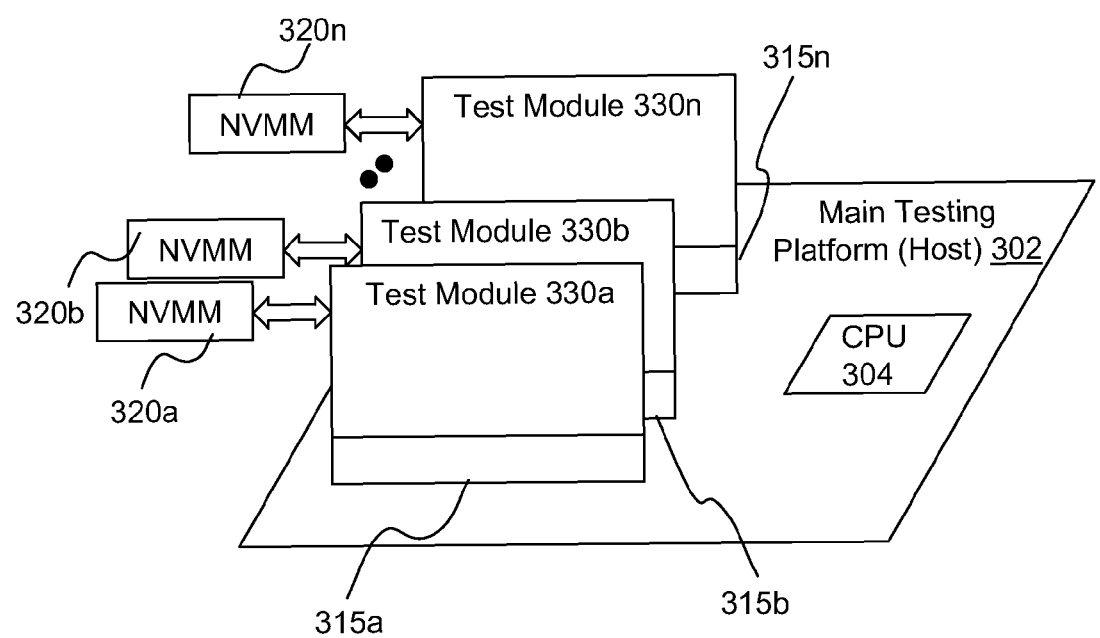
FIG. 3A is a perspective block diagram showing a main testing platform with a plurality of NVM test modules mounted thereon, each of the NVM test modules is configured for testing a respective NVM module, according to an embodiment of the present invention.

Referring to FIG. 3A, it is a perspective block diagram showing a main testing platform 302 with a plurality of NVM test modules 330*a-n* mounted thereon, each of the NVM test modules 330*a-n* is configured for testing a respective NVM module 320*a-n*, according to an embodiment of the present invention. The main testing platform 302 (i.e., host) comprises a central processing unit (CPU) 304 and a plurality of system bus (e.g., Peripheral Component Interconnect Express (PCI-e)) slots 315*a-n*. Each of the slots 315*a-n* is configured to accommodate a respective one of a plurality of NVM test modules 330*a-n*. Each of the NVM test modules 330*a-n* is configured to receive one of a plurality of NVM modules 320*a-n* to be tested. The CPU 304 of the main testing platform 302 is configured to issue a master test command. Each of the NVM test modules 330*a-n* is then conducting a self contained function test with the respective one of the NVM modules 320*a-n* adapted thereon. In one embodiment, the main testing platform 302 may comprises a mother board of a personal computer with a plurality of PCI-e buses mounted thereon.

Figure 3B:
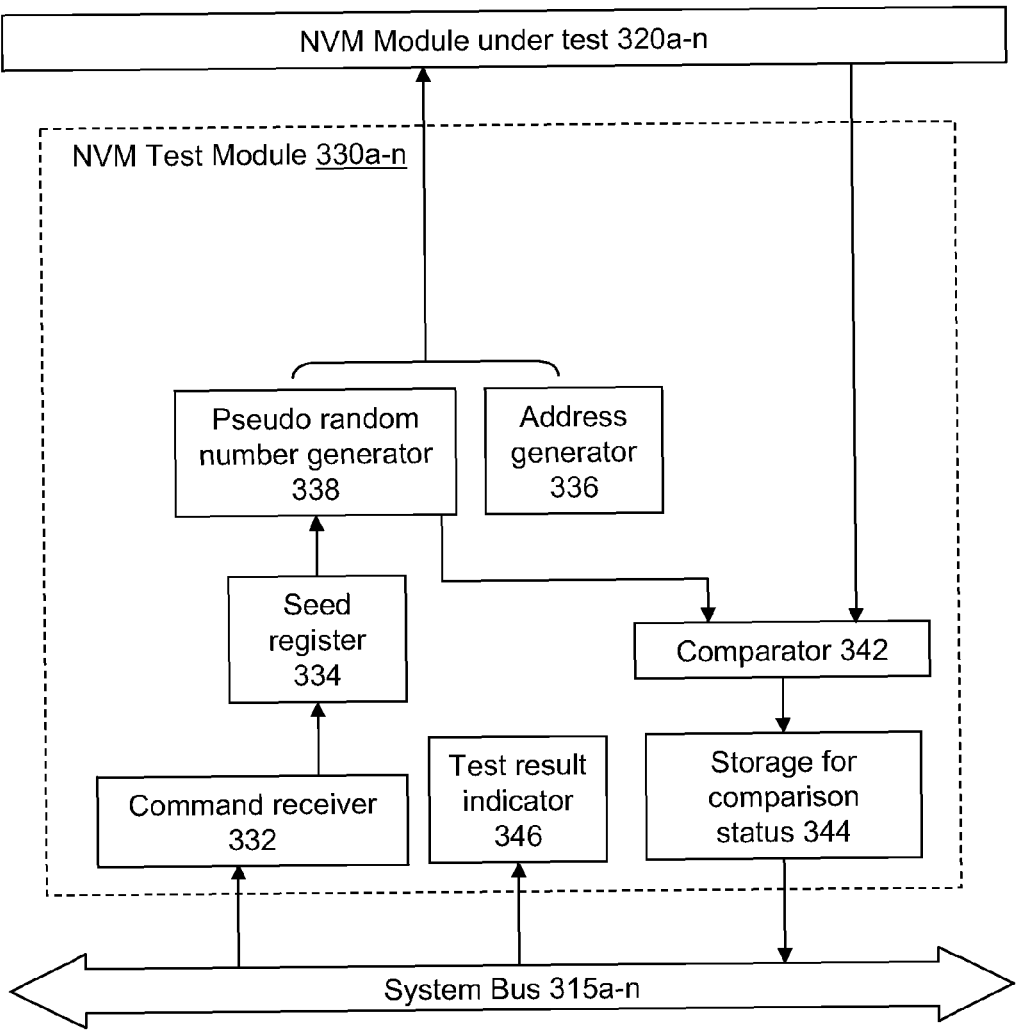
FIG. 3B is a block diagram showing salient components of one of the NVM test modules of FIG. 3A.

FIG. 3B is a block diagram showing one of the exemplary NVM test modules 330*a-n* adapted to one of the system bus slots 315*a-n* and coupled to one of the NVM modules 320*a-n* to be tested in accordance with one embodiment of the present invention. The NVM test module 330*a-n* comprises a command receiver 332, a pseudo random number generator (RNG) 338, a seed register 334, an address generator 336, a comparator 342, a comparison result storage space 344 and a test result indicator 346. The command receiver 332 is configured to receive the master test command issued by the main testing platform 302. The seed register 334 is configured to store a seed for generating pseudo random number sequence by the pseudo RNG 338. Value of the seed may be determined by the received master test command in one embodiment. The seed may be set by each of the NVM test modules 330*a-n* to a fixed value. The pseudo RNG 338 is configured to generate a repeatable random sequence of data bits (e.g., FIG. 8B). The repeatable random sequence of data bits is used as a test vector to verify the same data that have been written to the respective one of the NVM modules 320*a-n* under test. The address generator 336 is configured to create a start and an end address of the NVM module under test. The start and end addresses are configured for writing and read the test vector to and from the NVM module under test. The start and end addresses may only cover a portion of the NVM module 320*a-n*, such that only a portion of the NVM module may be tested. In other words, entire NVM module under test may be tested multiple times, each time with a different test vector. The test vector may also comprise a sequence of fixed pattern of data bits (e.g., FIG. 8A). In such case, the pseudo RNG 338 and the seed register 334 are not required. Instead a data generator (not shown in FIG. 3B) may be used.

Once created, the test vector is written to the NVM module 320*a-n* under test from the starting to the end address. The stored data are retrieved or read back to the NVM test module 330*a-n* thereafter. The retrieved data is compared with the test vector at the comparator 342. The comparison status is stored in a storage space 344 and reported back to the main testing platform 302. When the test vector is a repeatable random sequence, the test vector may need to be regenerated during the comparison phase of the testing. The test result indicator 346 is configured to show the test result in an easy and intuitive manner, for example, a color light with green, red and yellow. The green represents a 'passed' status, while the red represents a 'failed' status, and the yellow may represent a test is running or other meanings.

Figure 4A:
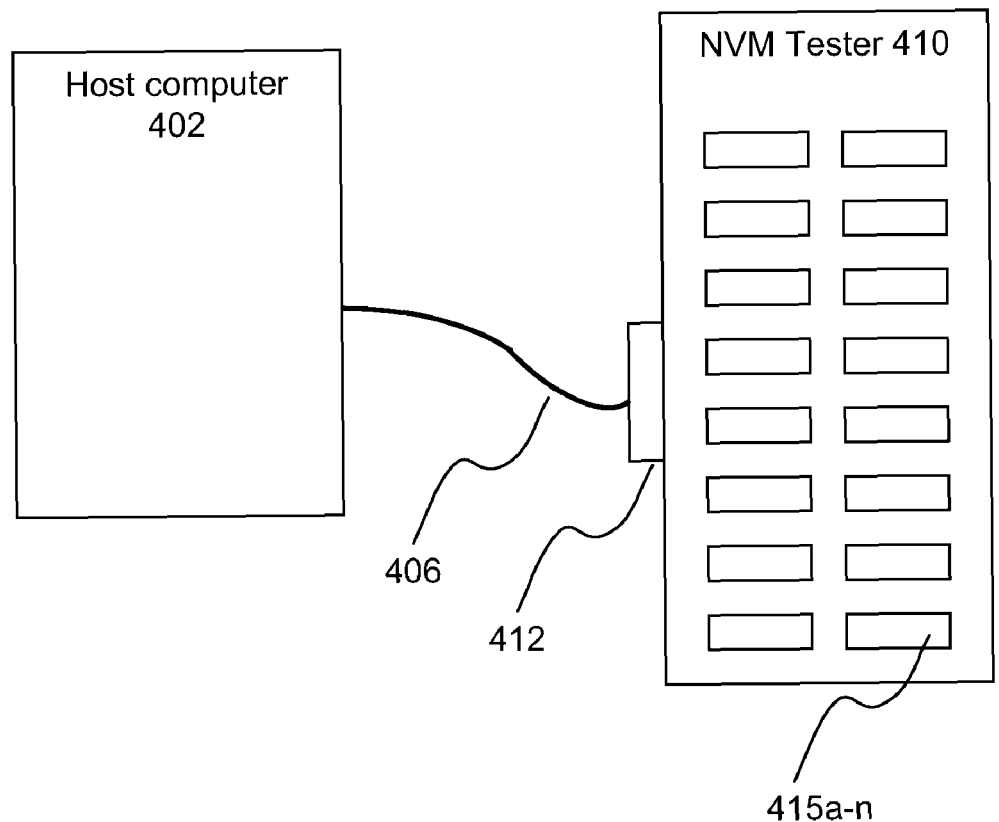
FIG. 4A is a block diagram showing a host computer with a high speed external bus (e.g., Universal Serial Bus (USB)) based NVM test module configured for testing a plurality of NVM modules, according to another embodiment of the present invention.

FIG. 4A is block diagram showing a host computer 402 with an exemplary high speed external bus (e.g., Universal Serial Bus (USB)) based NVM tester 410 configured for testing a plurality of NVM modules, according to another embodiment of the present invention. The NVM tester 410 comprises an external bus connector 412 (e.g., USB connector) and a plurality of external bus slots 415*a-n*. The external bus connector 412 is configured for connecting the host computer 402 via a connector cable 406, which is configured to transmit data, control signals and power. The plurality of the external bus slots 415*a-n* is configured to accommodate a plurality of NVM modules 420*a-n* under test, respectively.

Figure 4B:
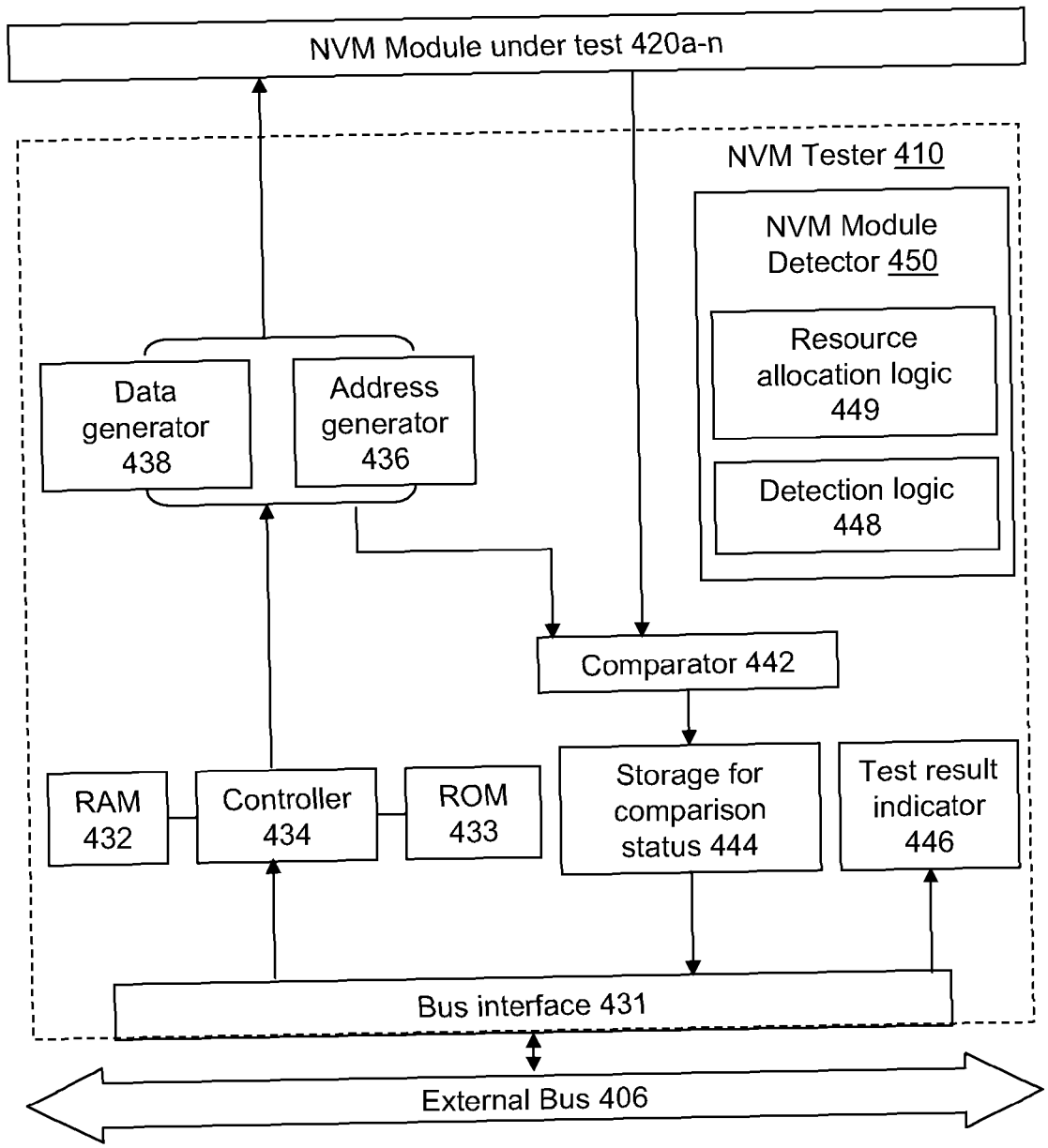
FIG. 4B is a block diagram showing salient components of the NVM test module of FIG. 4A.

A function block diagram of the NVM tester 410 is shown in FIG. 4B according to an embodiment of the present invention. The tester 410 comprises an external bus interface 431, a controller 434, a read-only memory (ROM) 433, a general purpose random access memory (RAM) 432, a data generator 438, an address generator 436, a comparator 442, a comparison status storage space 444, a test result indicator 446 and a NVM module detector 450.

The external bus interface 431 (e.g., USB interface) is configured to facilitate data, control signals and power transmission between the host computer 402 and the NVM tester 410. The controller 434 is configured to manage and control all of the functions of the NVM tester 410. Coupling to the controller 434, the RAM 432 is configured to be a main memory space for the controller 434, while the ROM 433 is configured to be a memory space for storing firmware or other software. The data generator 438 is configured to generate a test vector containing a sequence of repeatable data bits used in the function test of the NVM module 420*a-n*. The data generator may comprise a pseudo RNG and a seed register in one embodiment. The address generator 436 is configured to generate a starting address and an end address, such that the function test may be conducted in only a portion of the NVM module under test 420*a-n*. The comparator 442, the comparison status storage space 444 and the test result indicator 446 are the same as or substantially similar to those of the NVM test module 330*a-n* described above in FIG. 3B.

Due to multiple NVM modules 420a-n being tested within one NVM tester 410, the NVM module detector 450 is configured to determine which slots are occupied by NVM modules. The detector 450 comprises detection logic 448 and resource allocation logic 449.

Figure 5A:
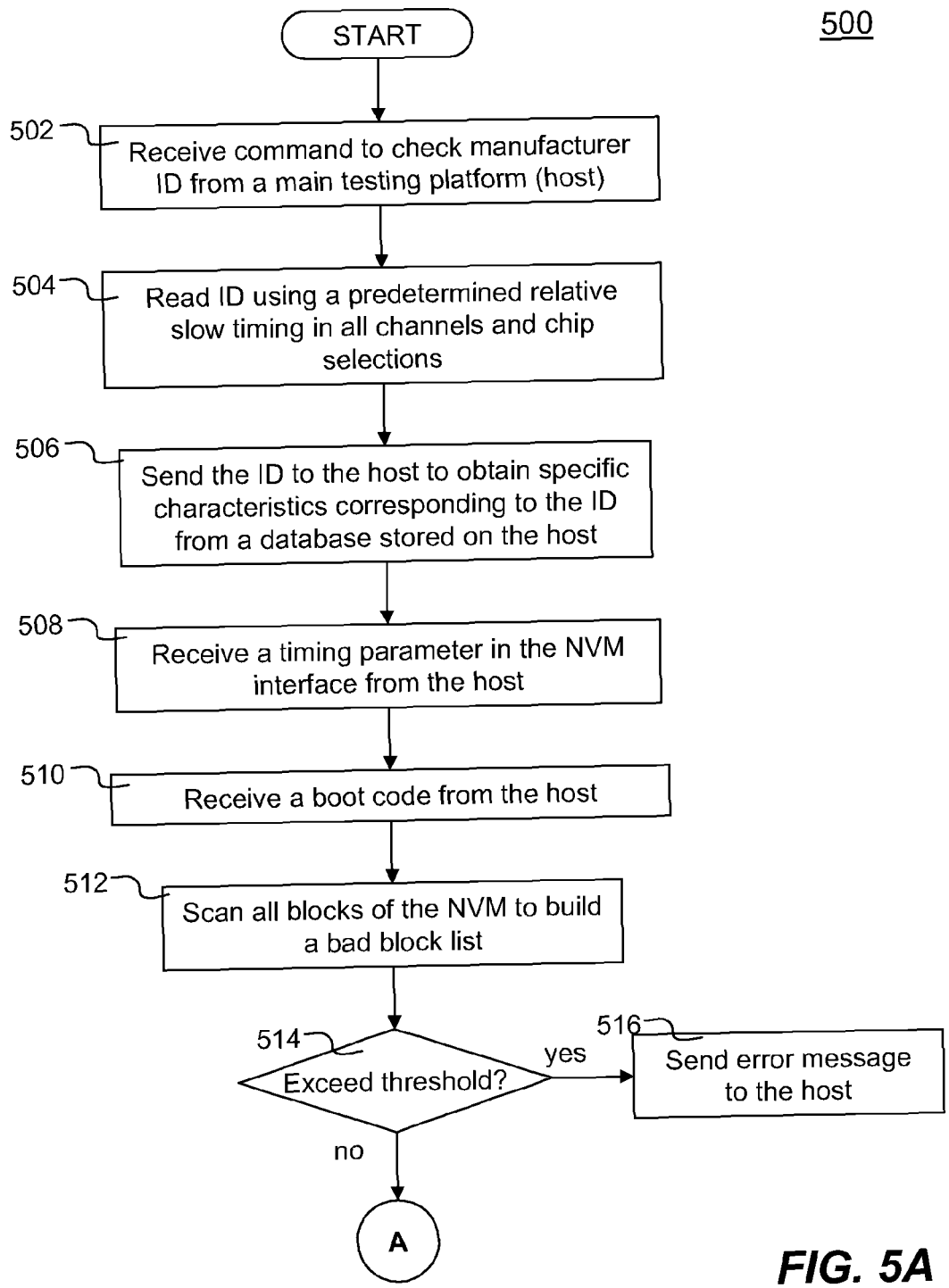
FIGS. 5A-C collectively is a flowchart illustrating an exemplary process of the function test used in the exemplary process of manufacturing and testing procedure of a non-volatile memory device by a memory module assembler in accordance with one embodiment of the present invention.
Figure 5B:
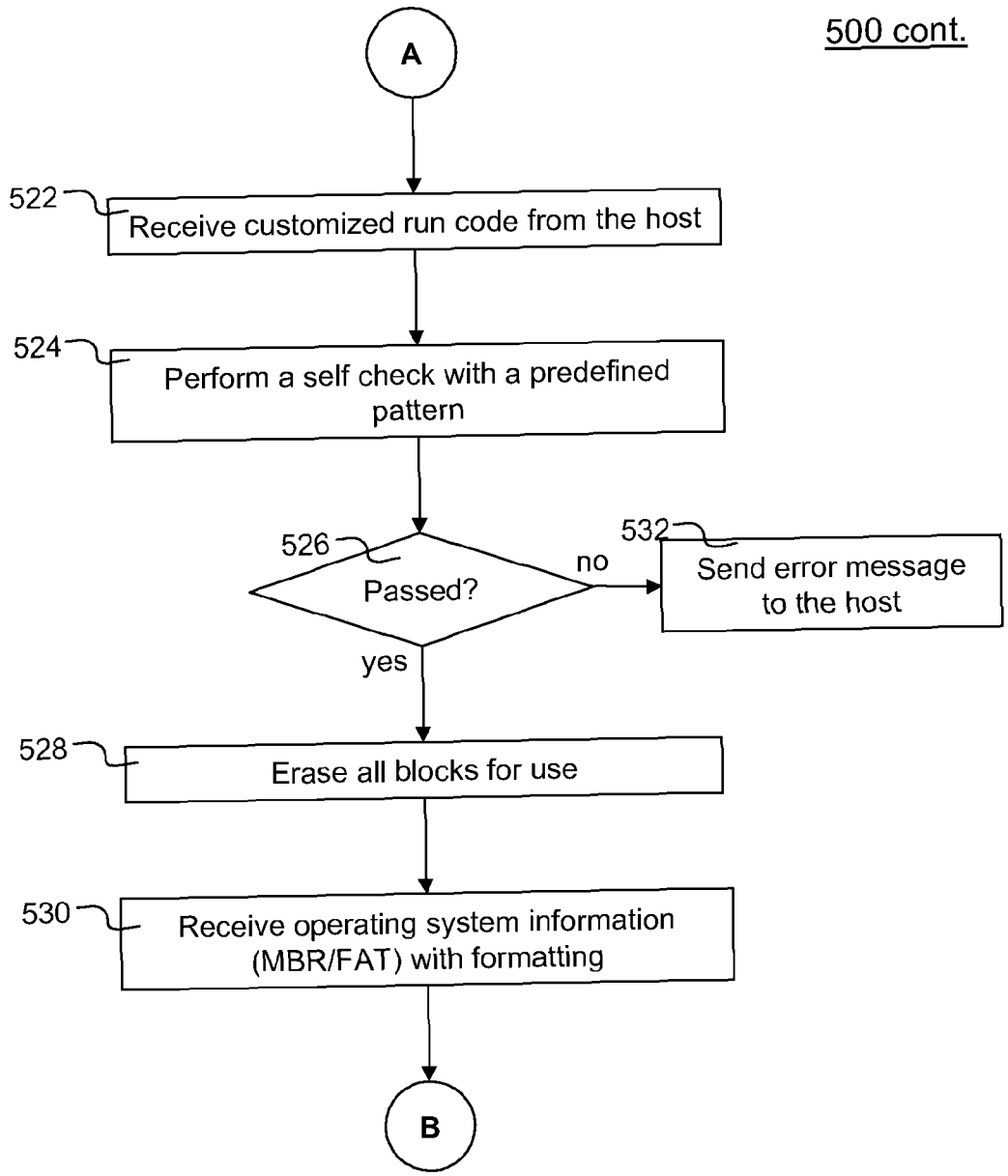
Figure 5C:
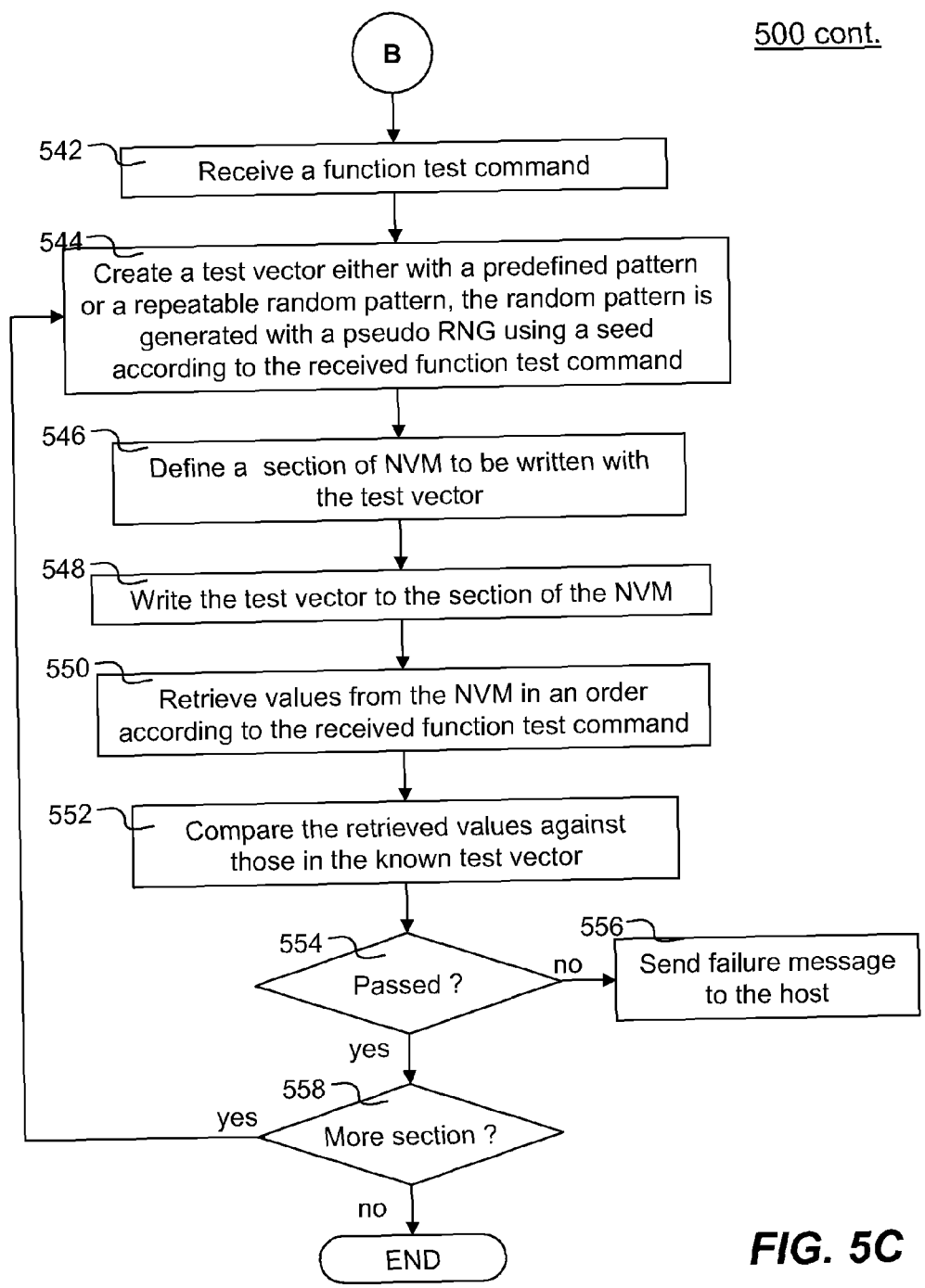

Referring now to FIGS. 5A-C, there is shown a flowchart illustrating an exemplary process 500 of the function test used in the exemplary process 100 of FIGS. 1A-B in accordance with one embodiment of the present invention. The process 500 is preferably understood in conjunction with other figures especially FIGS. 1A-B, 3A-B, 4A-B, and 8A-B. The process 500 starts by receiving a command at each of the NVM modules 320a-n under test from a main test platform 302 (i.e., referred to hereinafter as "host" in FIGS. 5A-C) to check the manufacturer's identification (ID) of the respective one of the NVM modules 320a-n under test at 502. Next, at 504, the ID is retrieving or read using a predetermined relatively slow timing cycles in all of the NVM data channels and all of the NVM chip selections. For example, address '90h' of a flash memory chip is generally reserved for storing such ID.

At 506, the process 500 then sends the retrieved ID back to the host 302 to obtain specific characteristics corresponding to the ID from a database stored on the host 302. For example, ID may show the NVM module 320a-n under test containing a particular manufacturer's flash memory chip. The entry corresponding to the ID in the database that contains the particulars. Next, at 508, the particular timing parameter corresponding to the ID is received in the timing register of the NVM module interface. Using the appropriate timing parameter, the NVM module 320a-n can receive a boot code from the host 302 at 510, for example, clock rate, number of timing cycles, etc.

With the boot code installed, the NVM module 320a-n then scans all blocks of the NVM to build a bad block list at 512. Next at decision 514, it is determined whether the number of the bad blocks exceeds a predefined threshold. If 'yes', an error message is sent to the host 302 indicating a defective NVM module 320a-n at 516. Otherwise at 522, the NVM module 320a-n receives a customized run code from the host 302. With both the boot code and run code installed, the NVM module 320a-n performs a self check with a predefined data pattern at 524. At decision 526, it is determined if the NVM module 320a-n has passed the self check. If 'no', the NVM module 320a-n sends an error message to the host 302 to indicate the module is defective at 532. Otherwise, the process 500 erases all of the data blocks in the NVM module at 528. Then, the NVM module 320a-n is formatted with an operating system image (e.g., master boot record, file allocation table, etc.) at 530.

After formatting is done, the NVM module 320a-n is finally ready for receiving data from a user. The function test in the manufacturing and testing process 100 of FIGS. 1A-B is a test to simulate usage of the NVM module 320a-n by such user. At 542, each of the NVM test modules 330a-n receives a function test command from the host 302. Accordingly, each of the test modules 330a-n creates a test vector at 544. The test vector is repeatable deterministic sequence of data bits. In one embodiment, the test vector comprises a fixed pattern such as an exemplary sequence shown in FIG. 8A. In another embodiment, the test vector comprises a random pattern such as the exemplary sequence shown in FIG. 8B. The fixed pattern may be generated by the test module 330a-n based on the function test command, for example, a particular command may trigger a test vector containing alternating zeros and ones. The random pattern is generated by a pseudo random number generator with a seed. The seed may be determined by a particular command such that the random pattern can be reproduced with the same seed.

Next, at 546, a section of the NVM module 320a-n under test is defined with a starting and an end address. The NVM module 320a-n may be divided into at least one section. At 548, the test vector is written to the defined section of the NVM module 320a-n. Then the stored values in the section is retrieved or read back to the NVM test module 320a-n at 550. The retrieved values are compared with the known test vector at 552. The known test vector may be regenerated such that there is no requirement of storing the known test vector. At decision 554, it is determined whether the NVM module 320a-n passes the comparison. If 'no' an error message is sent to the host 302 at 556 indicating the module is defective (e.g., a red indictor light is turned on). Otherwise, the process 500 moves to another decision 558 to determine whether there is another section to conduct further function test. If 'yes', the process 500 moves back to 544 to repeat the steps described in process 500 herein. Otherwise the process 500 ends and shows the NVM module 320a-n under test has passed the function test (e.g., a green indicator light is turned on).

Figure 6A:
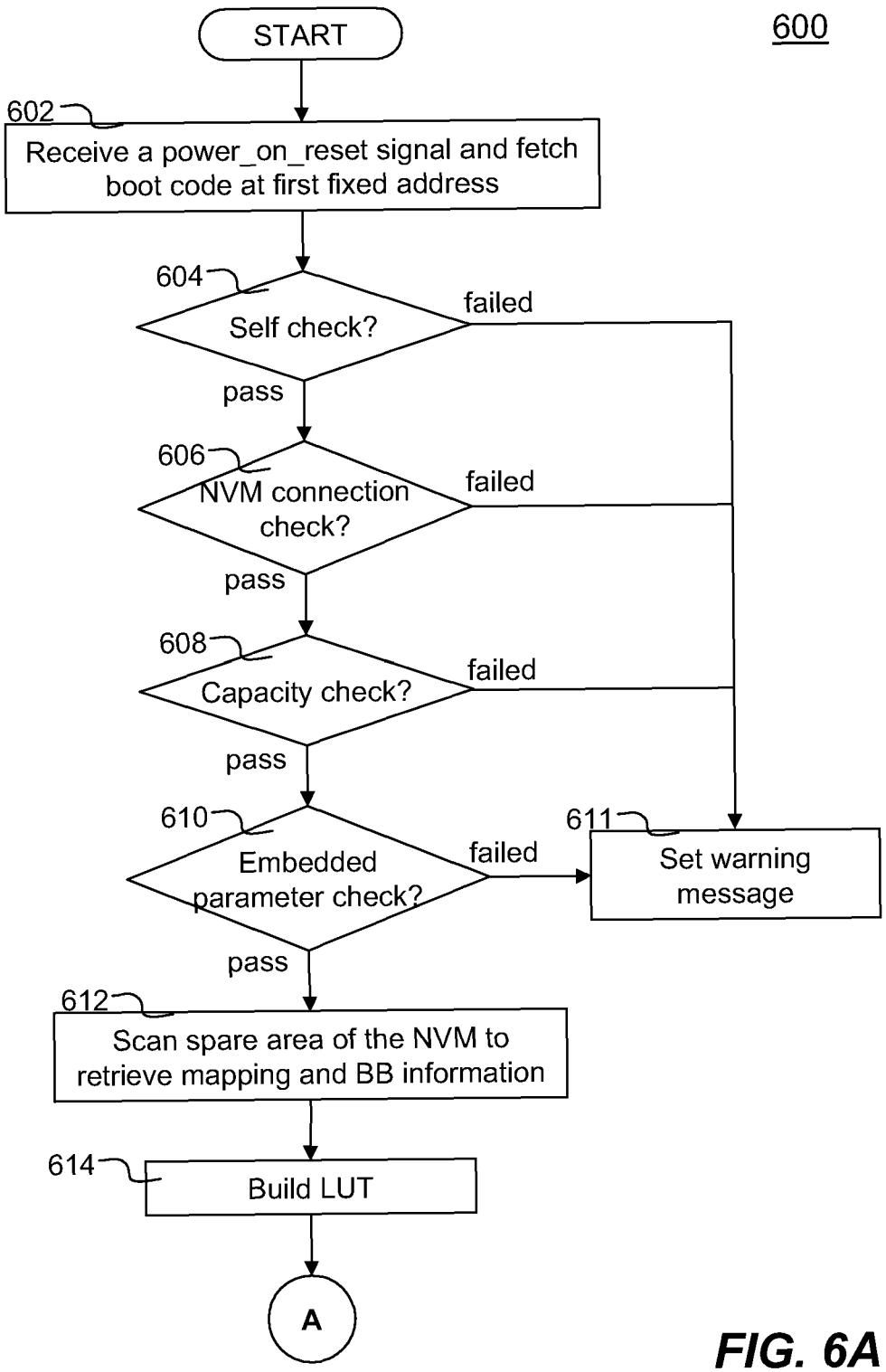
FIGS. 6A-B collectively is a flowchart illustrating an exemplary process of boot code during a power on or reset in a NVM module, according to an embodiment of the present invention.
Figure 6B:
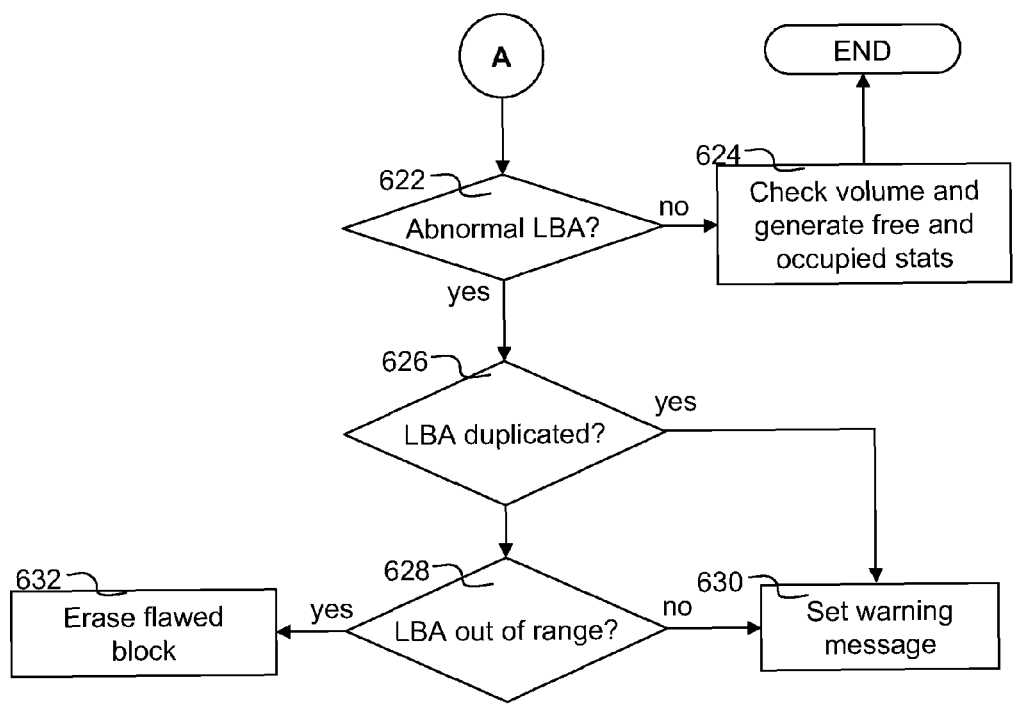

FIGS. 6A-B collectively is a flowchart illustrating an exemplary process 600 of boot code during a power on or reset in a NVM device, according to an embodiment of the present invention. The process 600 starts when the NVM device receives a 'power_on_reset' signal at 602. In response to the signal, the NVM device fetches the boot code from first fixed address. Next a self check is performed at decision 604. If 'failed', the process 600 sets a warning message at 611. Otherwise a NVM connection check is performed at decision 606. Similarly if 'failed', the process 500 sets the warning message at 611. Otherwise the process 600 moves to another decision 608, it is determined whether the capacity matches the predefined number. The warning message is set if 'failed'. If 'pass', the process 600 moves to decision 610 to determine whether embedded parameters are matched with the predefined values. If 'pass', the NVM device scans spare area of the NVM to retrieve logical block address and bad block (BB) information at 612. A logical-to-physical block address look up table (LUT) is built using the retrieved information at 614.

Next, the process 600 moves to decision 622 to determine if there is any abnormal logical block address (LBA). If 'no', the NVM device checks volume and generates free and occupied statistics at 624 and the process 600 ends. Otherwise, if 'yes', the process 600 moves to another decision 626, it is determined whether the LBA is duplicated. If 'yes', a warning message is set at 630. Otherwise if 'no', another decision 628 determines whether the LBA is outside of a predetermined range. If 'no', a warning message is set at 630. Otherwise, the duplicated LBA is erased for reuse.

FIGS. 7A-B collectively shows various parameters may be included in testing of NVM modules according one embodiment of the present invention. FIG. 7A shows parameters used in public area 702, secure area 704 and 'autorun' area 706 of a NVM module 320a-n under test. Vendor area 708 and parameters 710 are shown in FIG. 7B.

Figure 8A:
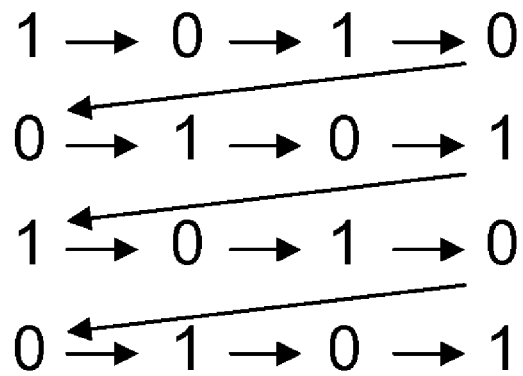
FIG. 8A is a diagram showing a fixed pattern sequence of data bits used in a test vector in the function test of FIGS. 5A-C.
Figure 8B:
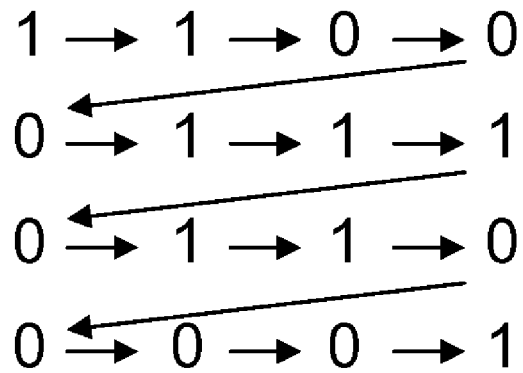
FIG. 8B is a diagram showing a random sequence of data bits used in a test vector in the function test of FIGS. 5A-C.

FIG. 8A is a diagram showing a fixed pattern sequence of data bits used in a test vector and FIG. 8B is a diagram showing a random sequence of data bits used in a test vector in the function test of FIGS. 5A-C.

Figure 9:
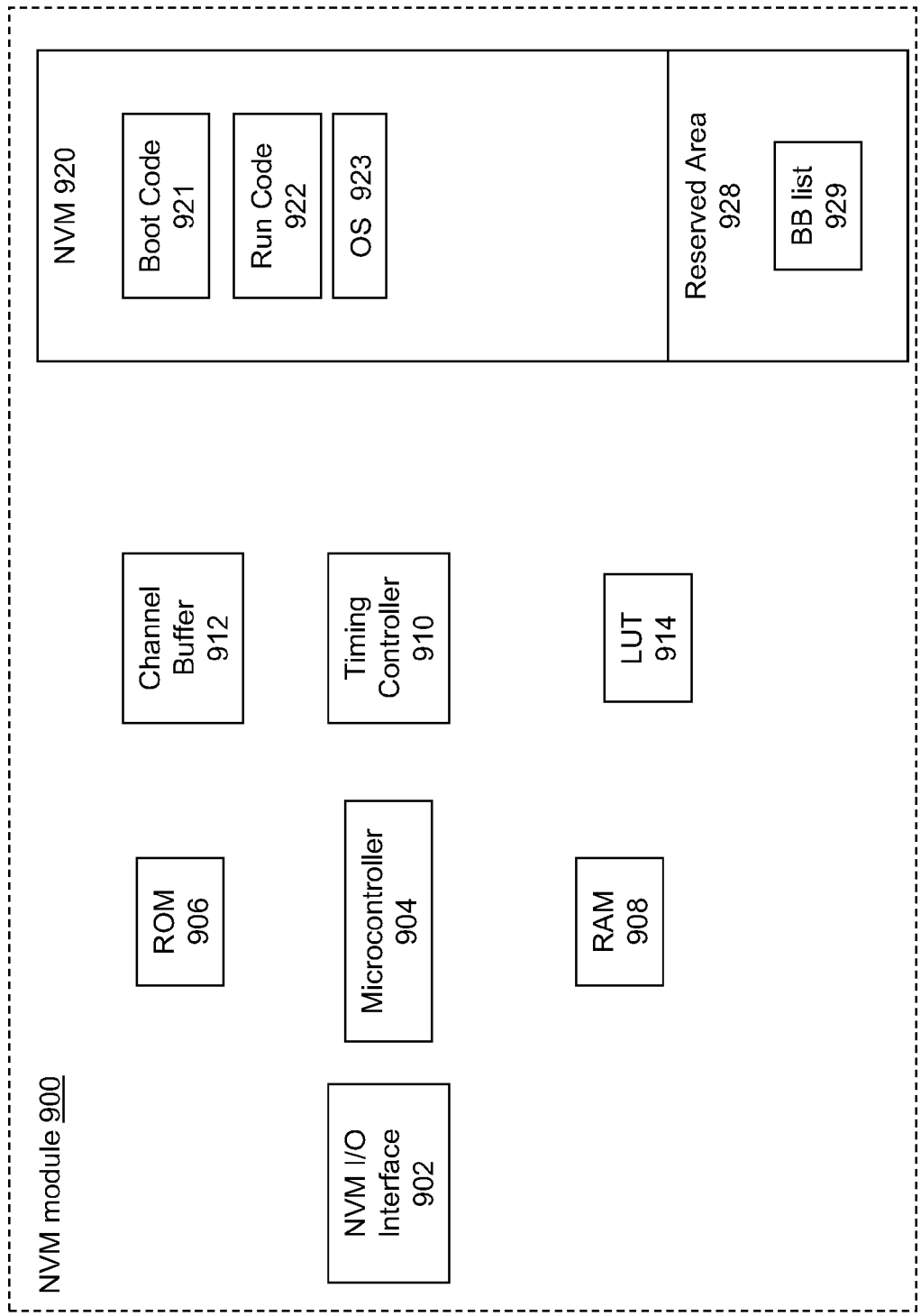
FIG. 9 is a block diagram showing salient components of an exemplary NVM module under the function test shown in FIGS. 5A-C, according to an embodiment of the present invention.

FIG. 9 is a block diagram showing salient components of an exemplary NVM module 900 under the function test shown in FIGS. 5A-C, according to an embodiment of the present invention. The NVM module 900 comprises a NVM input/output (I/O) interface 902, a microcontroller 904 with coupled random access memory (RAM) 908 and read-only memory (ROM) 906, a logical-to-physical address look up table (LUT) 914, a timing controller 910, at least one data channel buffer 912 and at least one NVM chip 820. The NVM I/O interface 902 is configured to transmit data between the NVM module 900 and a computing device when adapted to. The microcontroller 904 is configured to control the data transfer operations of the NVM module 900. The RAM 908 is configured as a primary storage space for the microcontroller 904 and the ROM 906 is configured to store firmware and other software for the microcontroller 904. The LUT 914 is configured to correlate logical block address with a physical block address in a one-to-one mapping scheme. The at least one data channel buffer 912 is configured to facilitate data transfer operations to and from the NVM 920. The timing controller 910 is configured to provide appropriate timing to access the NVM based on the manufacturer's ID. The at least one NVM 920 is configured to hold a boot code 921, a run code 922 and an operating system image (OS) 923 in the first one or few data blocks. In the reserved area 928 of the at least one NVM 920, a bad block (BB) list is kept. The reserved area 928 is also configured to perform data block swapping and other NVM related functions.

Figure 10A:
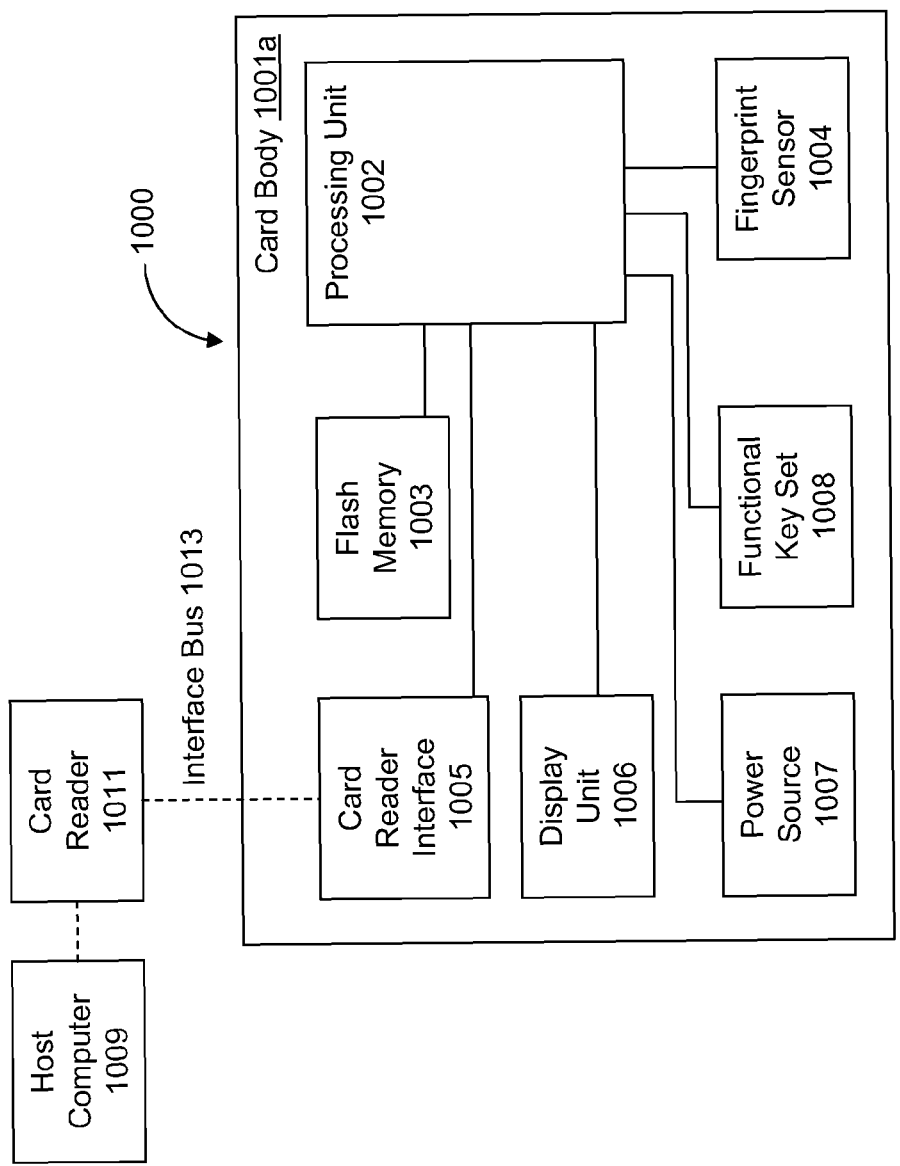
FIG. 10A is a block diagram showing salient components of a first exemplary NVM device (i.e., flash memory card with fingerprint verification capability), which may be manufactured and tested in accordance with one embodiment of the present invention.
Figure 10B:
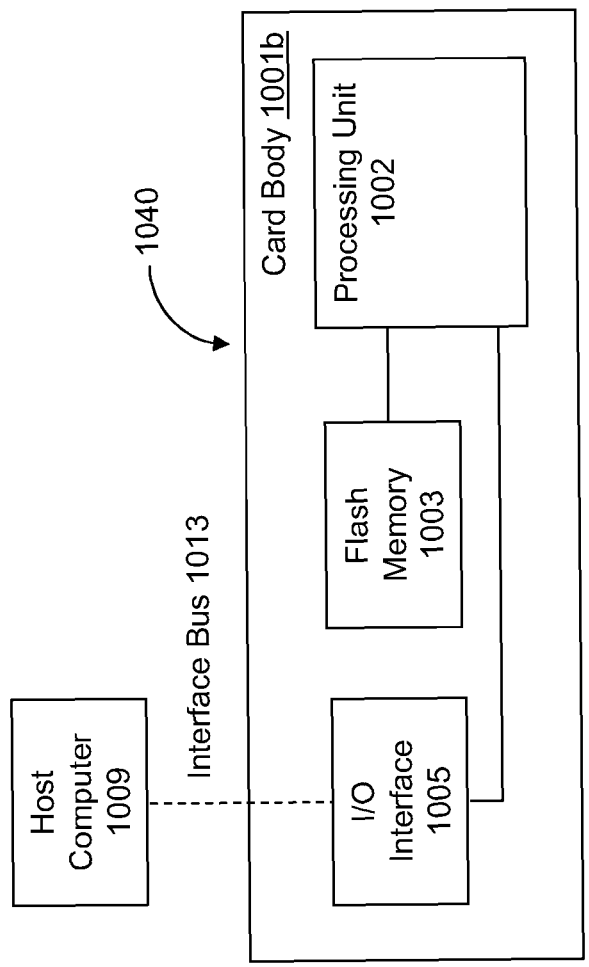
FIG. 10B is a block diagram showing salient components of a second exemplary NVM device (i.e., flash memory device with a separate flash memory controller), which may be manufactured and tested in accordance with one embodiment of the present invention.
Figure 10C:
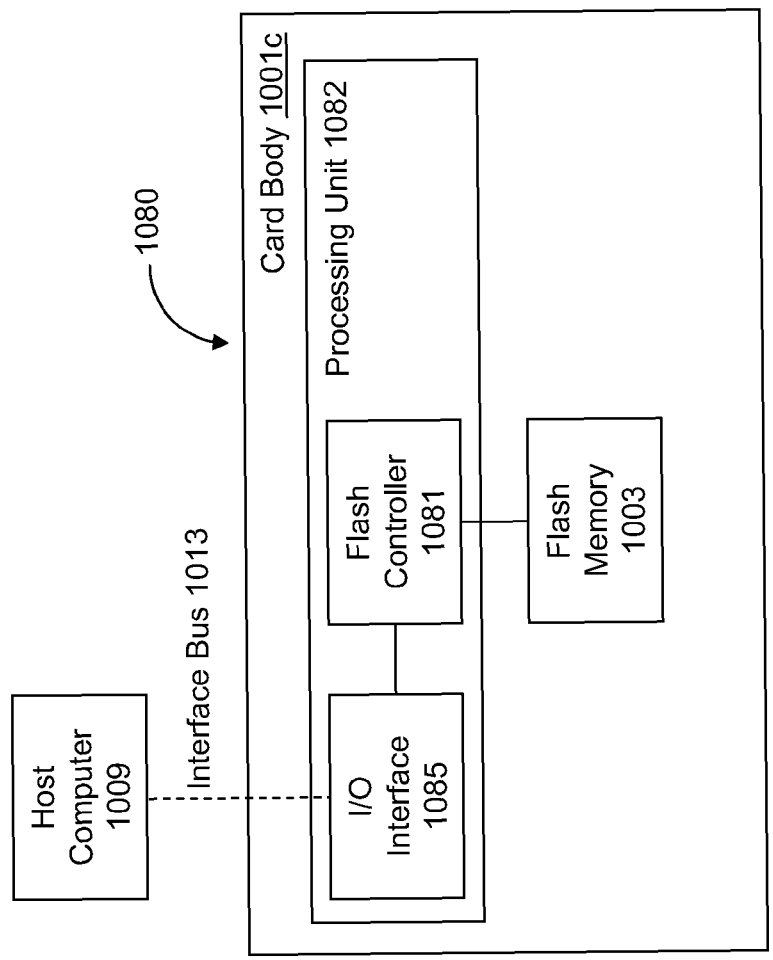
FIG. 10C is a block diagram showing salient components of a third exemplary NVM device (i.e., flash memory device with an integrated flash memory controller), which may be manufactured and tested in accordance with one embodiment of the present invention.

FIGS. 10A-10C are block diagrams illustrating three electronic environments, in which one embodiment of the present invention may be deployed in three respective exemplary electronic flash memory devices. Shown in FIG. 10A is a first electronic environment. A first flash memory device 1000 is adapted to be accessed by a card reader 1011 that couples to a host computing device 1009 via an interface bus 1013. The first flash memory device 1000 includes a card body 1001*a*, a processing unit 1002, at least one flash memory module 1003, a fingerprint sensor 1004, a card reader input/output (I/O) interface circuit 1005, an optional display unit 1006, an optional power source (e.g., battery) 1007, and an optional function key set 1008. The host computing device 1009 may include, but not be limited to, a desktop computer, a laptop computer, a mother board of a personal computer, a cellular phone, a digital camera, a digital camcorder, a personal multimedia player.

The card body 1001*a* is configured for providing electrical and mechanical connection for the processing unit 1002, the flash memory module 1003, the I/O interface circuit 1005, and all of the optional components. The card body 1001*a* may comprise a printed circuit board (PCB) or an equivalent substrate such that all of the components as integrated circuits may be mounted thereon. The substrate may be manufactured using surface mount technology (SMT) or chip on board (COB) technology.

The processing unit 1002 and the I/O interface circuit 1005 are collectively configured to provide various control functions (e.g., data read, write and erase transactions) of the flash memory module 1003. The processing unit 1002 may also be a standalone microprocessor or microcontroller, for example, an 8051, 8052, or 80286 Intel® microprocessor, or ARM®, MIPS® or other equivalent digital signal processor. The processing unit 1002 and the I/O interface circuit 1005 may be made in a single integrated circuit, for application specific integrated circuit (ASIC).

The at least one flash memory module 1003 may comprise one or more flash memory chips or integrated circuits. The flash memory chips may be single-level cell (SLC) or multi-level cell (MLC) based. In SLC flash memory, each cell holds one bit of information, while more than one bit (e.g., 2, 4 or more bits) are stored in a MLC flash memory cell.

The fingerprint sensor 1004 is mounted on the card body 1001*a*, and is adapted to scan a fingerprint of a user of the first electronic flash memory device 1000 to generate fingerprint scan data. Details of the fingerprint sensor 1004 are shown and described in a co-inventor's U.S. Pat. No. 7,257,714, entitled "Electronic Data Storage Medium with Fingerprint Verification Capability" issued on Aug. 14, 2007, the entire content of which is incorporated herein by reference.

The input/output interface circuit 1005 is mounted on the card body 1001*a*, and can be activated so as to establish communication with the host computing device 1009 by way of an appropriate socket via an interface bus 1013. The input/output interface circuit 1005 may include circuits and control logic associated with a Universal Serial Bus (USB) interface structure that is connectable to an associated socket connected to or mounted on the host computing device 1009. The input/output interface circuit 1005 may also be other interfaces including, but not limited to, Secure Digital (SD) interface circuit, Micro SD interface circuit, Multi-Media Card (MMC) interface circuit, Compact Flash (CF) interface circuit, Memory Stick (MS) interface circuit, PCI-Express interface circuit, a Integrated Drive Electronics (IDE) interface circuit, Serial Advanced Technology Attachment (SATA) interface circuit, external SATA, Radio Frequency Identification (RFID) interface circuit, fiber channel interface circuit, optical connection interface circuit.

The processing unit 1002 is controlled by a software program module (e.g., a firmware (FW)), which may be stored partially in a ROM (not shown) such that processing unit 1002 is operable selectively in: (1) a data programming or write mode, where the processing unit 1002 activates the input/output interface circuit 1005 to receive data from the host computing device 1009 and/or the fingerprint reference data from fingerprint sensor 1004 under the control of the host computing device 1009, and store the data and/or the fingerprint reference data in the flash memory module 1003; (2) a data retrieving or read mode, where the processing unit 1002 activates the input/output interface circuit 1005 to transmit data stored in the flash memory module 1003 to the host computing device 1009; or (3) a data resetting or erasing mode, where data in stale data blocks are erased or reset from the flash memory module 1003. In operation, host computing device 1009 sends write and read data transfer requests to the first flash memory device 1000 via the interface bus 1013, then the input/output interface circuit 1005 to the processing unit 1002, which in turn utilizes a flash memory controller (not shown or embedded in the processing unit) to read from or write to the associated at least one flash memory module 1003. In one embodiment, for further security protection, the processing unit 1002 automatically initiates an operation of the data resetting mode upon detecting a predefined time period has elapsed since the last authorized access of the data stored in the flash memory module 1003.

The optional power source 1007 is mounted on the card body 1001*a*, and is connected to the processing unit 1002 and other associated units on card body 1001*a* for supplying electrical power (to all card functions) thereto. The optional function key set 1008, which is also mounted on the card body 1001*a*, is connected to the processing unit 1002, and is operable so as to initiate operation of processing unit 1002 in a selected one of the programming, data retrieving and data resetting modes. The function key set 1008 may be operable to provide an input password to the processing unit 1002. The processing unit 1002 compares the input password with the reference password stored in the flash memory module 1003, and initiates authorized operation of the first flash memory device 1000 upon verifying that the input password corresponds with the reference password. The optional display unit 1006 is mounted on the card body 1001*a*, and is connected to and controlled by the processing unit 1002 for displaying data exchanged with the host computing device 1009.

Shown in FIG. 10B, a second electronic flash memory device 1040 includes a card body 1001b with a processing unit 1002, an I/O interface circuit 1005 and at least one flash memory module 1003 mounted thereon. Similar to the first flash memory device, the second flash memory device 1040 couples to the host computing device 1009 via the interface bus 1013.

FIG. 10C shows a third electronic flash memory device 1080 couples to the host computing device 1009 via the interface bus 1013. The third flash memory device 1080 comprises a card body 1001c with an integrated processing unit 1082 and at least one flash memory module 1003 mounted thereon. The integrated processing unit 1082 (e.g., System on a Chip (SoC)) includes an I/O interface 1085 and a flash memory controller 1081. The I/O interface 1085 is configured to transmit data, control signals and power between the computing device 1009 and the flash memory device 1080. The flash memory controller 1081 is configured to manage data transfer operations from and to the at least one flash memory module 1003.

Although the present invention has been described with reference to specific embodiments thereof, these embodiments are merely illustrative, and not restrictive of, the present invention. Various modifications or changes to the specifically disclosed exemplary embodiments will be suggested to persons skilled in the art. For example, whereas the main testing platform 302 has been described and shown in the exemplary process 500 of function test, the NVM tester 402 may also be used to accomplish the same. Additionally, whereas the test vector with a sequence of a fixed pattern has been shown and described as alternative zeros and ones. Other combinations may be used, for example, all zeros or all ones. Furthermore, whereas a USB bus has been described and shown in the NVM tester, other external interface may be used to achieve the same purpose. In summary, the scope of the invention should not be restricted to the specific exemplary embodiments disclosed herein, and all modifications that are readily suggested to those of ordinary skill in the art should be included within the spirit and purview of this application and scope of the appended claims.

What is claimed is:

1. A method of testing a plurality of non-volatile memory (NVM) modules comprising:
   conducting an initial open and short test on each of the plurality of NVM modules:
   dividing the plurality of NVM modules into first and second groups, the first group contains said each of the plurality of NVM modules fails in the initial open and short test, while the second group contains said each of the plurality of NVM modules passes the initial open and short test;
   conducting a temperature and voltage test on each of the second group of the NVM modules;
   dividing the second group into third and fourth groups, the third group contains said each of the second group that fails the temperature and voltage test and the fourth group contains said each of the second group that passes the temperature and voltage test;
   conducting a function test on each of the fourth group of the NVM modules:
   dividing the fourth group into fifth and sixth groups, the fifth group includes said each of the fourth group that fails the function test and the sixth group includes said each of the fourth group that passes the function test; and
   sending all of the first, third and fifth group of the NVM modules to a rework unit for fixing failure-causing defect:
   wherein the open and short test is configured to detect any open and short condition, and the temperature and voltage test is configured to determine whether operating temperature and voltage tolerance are met;
   wherein said conducting the function test further comprises:
   coupling at least one of the sixth group of the NVM modules to a plurality of NVM test modules mounted on a main testing platform, each of the at least one of the sixth group of the NVM modules corresponds to a respective one of the plurality of NVM test modules:
   initializing each of the at least one of the sixth group of the NVM modules by the main testing platform: and
   verifying data written to said each the at least one of the sixth group with a test vector created by the respective one of the NVM test modules:
   wherein said each of the at least one of the sixth group of the NVM modules further comprises:
   receiving a command from the host at said each of the at least one of the sixth group of the NVM modules to check manufacturer's identification (ID) of NVM;
   sending the ID to the main testing platform to obtain a set of specific characteristics corresponding to the ID in a database stored thereon;
   receiving a boot code and a run code to perform a self test; and
   when the self test passes, formatting said each of the at least one of the sixth group of the NVM modules and loading an operating system image thereto.

2. The method of claim 1 further comprising:
   conducting final quality assurance test under an operating temperature range between −40 and 85 degrees Celsius on each of the sixth group of the NVMs to determine whether said each of the sixth group of the NVMs operates without error.

3. The method of claim 1, receiving the boot code and the run code comprises receiving the NVM timing parameters at NVM interface in said each of the at least one of the sixth group of the NVM modules.

4. The method of claim 3, wherein the run code is customized by the host with the specific characteristics corresponding to the ID of said each of the at least one of the sixth group of the NVM modules.

5. The method of claim 1, further comprises determining a bad block list to ensure number of bad blocks is within an acceptable threshold for said each of the at least one of the sixth group of the NVM modules.

6. The method of claim 1, wherein the test vector comprises a known sequence of data bits.

7. The method of claim 1, wherein the test vector comprises a repeatable random sequence of data bits that is produced by a pseudo random number generator.

8. The method of claim 1, wherein the test vector is written to a portion of NVM in a predefined direction according to a special function test command.

9. The method of claim 8, the predefined direction includes forward and backward.

* * * * *